(12) United States Patent
Tang

(10) Patent No.: US 10,985,182 B2
(45) Date of Patent: Apr. 20, 2021

(54) METHODS FOR FORMING THREE-DIMENSIONAL MEMORY DEVICE WITHOUT CONDUCTOR RESIDUAL CAUSED BY DISHING

(71) Applicant: YANGTZE MEMORY TECHNOLOGIES CO., LTD., Wuhan (CN)

(72) Inventor: Zhao Hui Tang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 16/994,503

(22) Filed: Aug. 14, 2020

(65) Prior Publication Data

US 2020/0381452 A1 Dec. 3, 2020

Related U.S. Application Data

(60) Division of application No. 16/297,525, filed on Mar. 8, 2019, now Pat. No. 10,790,301, which is a
(Continued)

(51) Int. Cl.
*H01L 27/00* (2006.01)
*H01L 27/11582* (2017.01)
(Continued)

(52) U.S. Cl.
CPC .. *H01L 27/11582* (2013.01); *H01L 21/02164* (2013.01); *H01L 21/02271* (2013.01);
(Continued)

(58) Field of Classification Search
None
See application file for complete search history.

(56) References Cited

U.S. PATENT DOCUMENTS

2011/0065270 A1  3/2011  Shim et al.
2012/0168858 A1  7/2012  Hong
(Continued)

FOREIGN PATENT DOCUMENTS

CN   105977207 A   9/2016
CN   106206600 A   12/2016
(Continued)

OTHER PUBLICATIONS

International Search Report issued in corresponding International Application No. PCT/CN2019/074221, dated Oct. 30, 2019, 5 pages.
(Continued)

*Primary Examiner* — Reema Patel
(74) *Attorney, Agent, or Firm* — Bayes PLLC

(57) ABSTRACT

Embodiments of three-dimensional (3D) memory devices and methods for forming the same are disclosed. In an example, a 3D memory device includes a substrate, a memory stack, a channel structure, a first dielectric layer, and a second dielectric layer. The memory stack includes interleaved conductor layers and dielectric layers above the substrate. The memory stack includes a staircase structure at one edge of the memory stack. The channel structure extends vertically through the memory stack. The first dielectric layer is above the memory stack. A part of the first dielectric layer right above the staircase structure has a dished bottom surface. The second dielectric layer is on the part of the first dielectric layer right above the staircase structure and has a nominally flat top surface.

20 Claims, 13 Drawing Sheets

Related U.S. Application Data continuation of application No. PCT/CN2019/074221, filed on Jan. 31, 2019.

(51) Int. Cl.

| | | |
|---|---|---|
| *H01L 29/10* | (2006.01) | |
| *H01L 21/02* | (2006.01) | |
| *H01L 21/768* | (2006.01) | |
| *H01L 21/311* | (2006.01) | |
| *H01L 21/321* | (2006.01) | |
| *H01L 29/66* | (2006.01) | |
| *H01L 21/28* | (2006.01) | |
| *H01L 27/06* | (2006.01) | |
| *H01L 27/11524* | (2017.01) | |
| *H01L 27/1157* | (2017.01) | |

(52) U.S. Cl.
CPC .. *H01L 21/02282* (2013.01); *H01L 21/02532* (2013.01); *H01L 21/02595* (2013.01); *H01L 21/31111* (2013.01); *H01L 21/3212* (2013.01); *H01L 21/7684* (2013.01); *H01L 21/76802* (2013.01); *H01L 21/76877* (2013.01); *H01L 27/0688* (2013.01); *H01L 27/1157* (2013.01); *H01L 27/11524* (2013.01); *H01L 29/1037* (2013.01); *H01L 29/40117* (2019.08); *H01L 29/66545* (2013.01)

(56) References Cited

U.S. PATENT DOCUMENTS

| | | | |
|---|---|---|---|
| 2012/0175777 A1 | 7/2012 | Hill et al. | |
| 2013/0065386 A1 | 3/2013 | Kim et al. | |
| 2014/0015018 A1* | 1/2014 | Kim | H01L 29/78 257/288 |
| 2016/0276359 A1 | 9/2016 | Oginoe et al. | |
| 2016/0322379 A1* | 11/2016 | Oomori | H01L 27/11565 |
| 2017/0077122 A1* | 3/2017 | Ono | H01L 27/11575 |

FOREIGN PATENT DOCUMENTS

| | | |
|---|---|---|
| CN | 108461503 A | 8/2018 |
| CN | 108899321 A | 11/2018 |
| CN | 109196643 A | 1/2019 |
| CN | 109216198 A | 1/2019 |

OTHER PUBLICATIONS

Written Opinion of the International Searching Authority issued in corresponding International Application No. PCT/CN2019/074221, dated Oct. 30, 2019, 4 pages.

\* cited by examiner

METHODS FOR FORMING THREE-DIMENSIONAL MEMORY DEVICE WITHOUT CONDUCTOR RESIDUAL CAUSED BY DISHING

CROSS REFERENCE TO RELATED APPLICATION

This application is divisional of U.S. application Ser. No. 16/297,525, filed on Mar. 8, 2019, entitled "METHODS FOR FORMING THREE-DIMENSIONAL MEMORY DEVICE WITHOUT CONDUCTOR RESIDUAL CAUSED BY DISHING," which is continuation of International Application No. PCT/CN2019/074221, filed on Jan. 31, 2019, entitled "METHODS FOR FORMING THREE-DIMENSIONAL MEMORY DEVICE WITHOUT CONDUCTOR RESIDUAL CAUSED BY DISHING," both of which are hereby incorporated by reference in their entireties.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices and fabrication methods thereof are disclosed herein.

In one example, a method for forming a 3D memory device is disclosed. A channel structure extending vertically through a dielectric stack including interleaved sacrificial layers and dielectric layers is formed above a substrate. A dummy channel structure extending vertically through the dielectric stack is formed by depositing a dummy dielectric layer on the dielectric stack and in a dummy channel hole. An elevating dielectric layer is formed on the dummy dielectric layer. A slit opening extending vertically through the elevating dielectric layer, the dummy dielectric layer, and the dielectric stack is formed. A memory stack including interleaved conductor layers and the dielectric layers is formed above the substrate by replacing, through the slit opening, the sacrificial layers with the conductor layers. A source contact is formed in the slit opening by depositing a source conductor layer on the elevating dielectric layer and in the slit opening. The source conductor layer on the elevating dielectric layer and at least a part of the elevating dielectric layer are removed.

In another example, a method for forming a 3D memory device is disclosed. A channel structure and a dummy channel structure each extending vertically through a dielectric stack including interleaved sacrificial layers and dielectric layers are formed above a substrate. An elevating dielectric layer is formed above the dielectric stack. A thickness of the elevating dielectric layer is not less than about 100 nm. A slit opening extending vertically through the elevating dielectric layer and the dielectric stack is formed. A memory stack including interleaved conductor layers and the dielectric layers is formed above the substrate by replacing, through the slit opening, the sacrificial layers with the conductor layers. The memory stack includes a staircase structure at one edge of the memory stack. A source contact is formed in the slit opening by depositing a source conductor layer on the elevating dielectric layer and in the slit opening. The source conductor layer on the elevating dielectric layer and a part of the elevating dielectric layer are removed. A word line contact extending vertically through the remaining part of the elevating dielectric layer is formed to contact one of the conductor layers in the staircase structure of the memory stack.

In still another example, a 3D memory device includes a substrate, a memory stack, a channel structure, a first dielectric layer, and a second dielectric layer. The memory stack includes interleaved conductor layers and dielectric layers above the substrate. The memory stack includes a staircase structure at one edge of the memory stack. The channel structure extends vertically through the memory stack. The first dielectric layer is above the memory stack. A part of the first dielectric layer right above the staircase structure has a dished bottom surface. The second dielectric layer is on the part of the first dielectric layer right above the staircase structure and has a nominally flat top surface.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
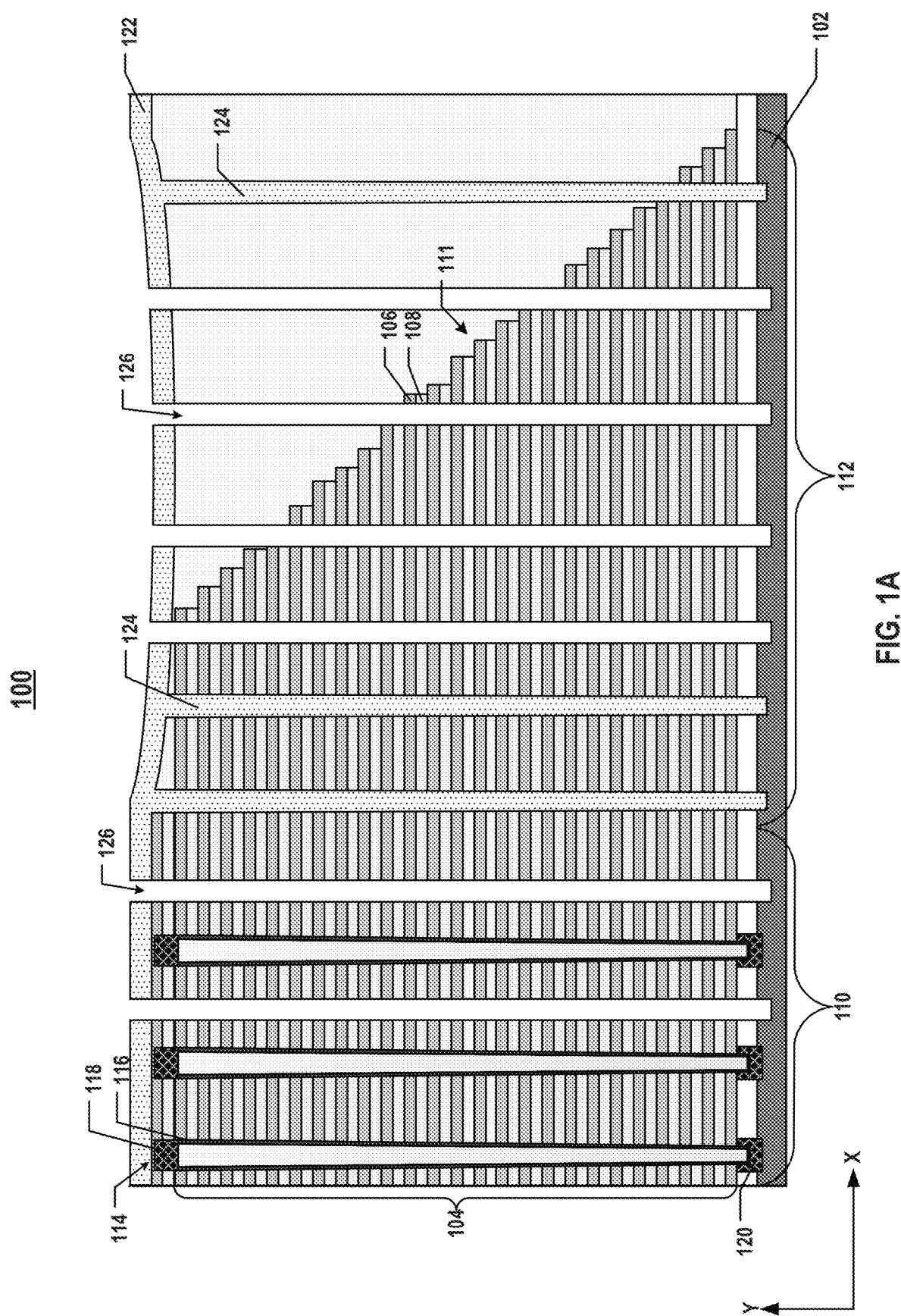
FIGS. 1A-1C illustrate an exemplary fabrication process for a 3D memory device with conductor residual caused by dishing.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend laterally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In fabricating some 3D memory devices, post-gate line slit (GLS) etch and thermal process, the stress of dielectric stack (e.g., interleaved silicon oxide and silicon nitride layers) and other dielectric layer(s) is released in the staircase region. The resulting dishing effect to the dielectrics in the staircase region may create residual of the conductor material for forming source contacts (e.g., array common source (ACS) contacts), which cannot be fully removed by planarizing the conductor material, for example, by chemical mechanical polishing/planarization (CMP). The conductor residual is undesirable as it can block the subsequent etching process for forming the word line contacts (also known as "staircase contacts"), which directly leads to memory function failure.

Figure 1B:
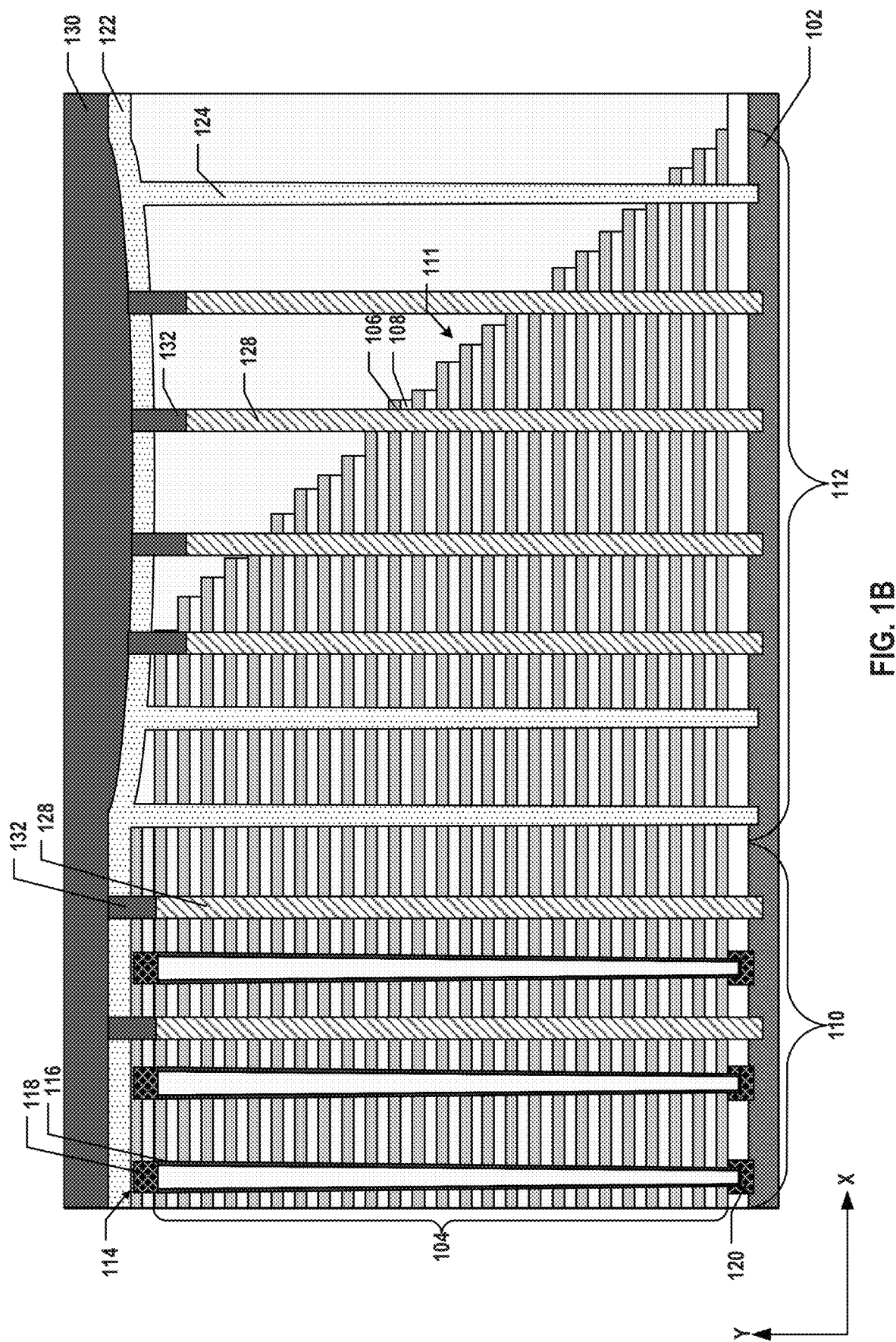
Figure 1C:
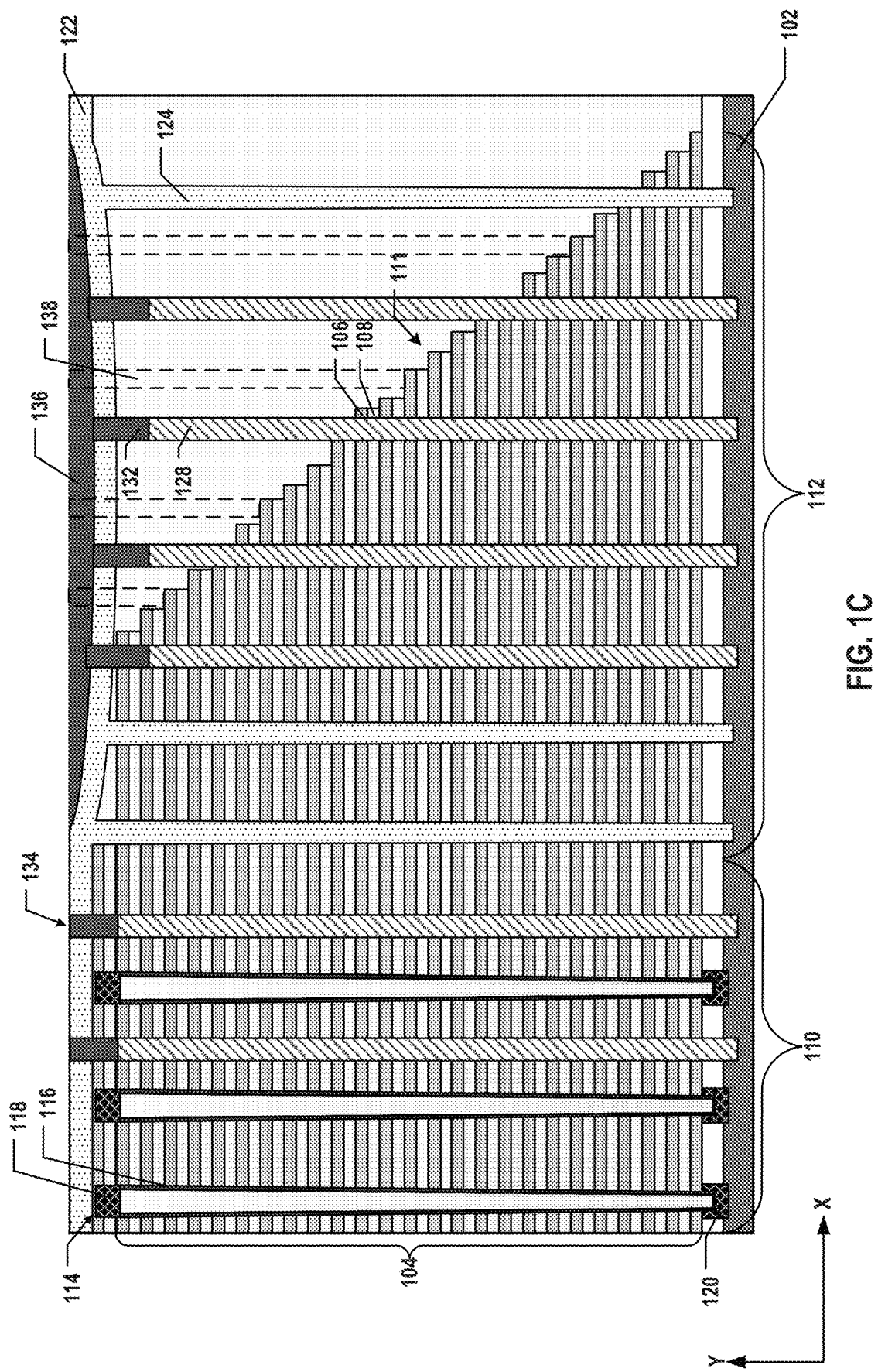

For example, FIGS. 1A-1C illustrate an exemplary fabrication process for a 3D memory device 100 with conductor residual caused by dishing. As shown in FIG. 1A, 3D memory device 100 includes a memory stack 104 formed above a substrate 102. Memory stack 104 includes interleaved conductor layers 106 (e.g., tungsten layers) and dielectric layers 108 (e.g., silicon oxide layers). The number of conductor/dielectric layer pairs determines the number of "levels" (also known as "tiers," e.g., 32, 64, 96, 128, etc.) of 3D memory device 100. Memory stack 104 can be laterally divided into two regions: an inner region 110 (also known as a "core array region") and an outer region 112 (also known as a "staircase region"). A staircase structure 111 is formed in outer region 112 on one edge of memory stack 104. It is noted that x and y axes are included in FIG. 1A to further illustrate the spatial relationship of the components in 3D memory device 100. Substrate 102 of 3D memory device 100 includes two lateral surfaces (e.g., a top surface and a bottom surface) extending laterally in the x-direction (i.e., the lateral direction). As used herein, whether one component (e.g., a layer or a device) is "on," "above," or "below" another component (e.g., a layer or a device) of a 3D memory device (e.g., 3D memory device 100) is determined relative to the substrate of the 3D memory device (e.g., substrate 102) in the y-direction (i.e., the vertical direction) when the substrate is positioned in the lowest plane of the 3D memory device in the y-direction. The same notion for describing spatial relationship is applied throughout the present disclosure.

3D memory device 100 may be a 3D NAND Flash memory, and an array of NAND memory strings 114 are formed in inner region 110 of memory stack 104. Each NAND memory string 114 includes a channel structure 116 extending vertically through memory stack 104 as well as two plugs 118 and 120 at each respective end of NAND memory string 114 in the vertical direction. Plugs 118 and 120 can function as the channel controlled by a source select gate of NAND memory string 114 and the drain of NAND memory string 114, respectively. 3D memory device 100 also includes dummy channel structures 124 formed in inner region 110 and outer region 112 of memory stack 104 by depositing a dummy dielectric layer 122 on memory stack 104 and in a plurality of dummy channel holes. Different from channel structures 116, a contact is not formed on dummy channel structure 124 to avoid electrical connections with other components of 3D memory device 100.

As shown in FIG. 1A, slit openings 126 (e.g., GLSs) are formed vertically through memory stack 104 to reach substrate 102 in inner region 110 and outer region 112 of memory stack 104. Slit openings 126 are used as the passageway for forming memory stack 104 by gate replacement processes, which etch away sacrificial layers (not shown, e.g., silicon nitride layers) between dielectric layers 108 and replace the sacrificial layers with conductor layers 106. The etch process of slit openings 126 and subsequent gate replacement processes release the stress of staircase structure 111 of memory stack 104 in outer region 112, which can cause shrinkage of dielectrics in outer region 112. Also, the etching of slit openings 126 may also cause wafer bow and/or wafer warpage in some cases. As a result, dishing occurs at part of dummy dielectric layer 122 and the dielectrics underneath in outer region 112 (e.g., right above staircase structure 111) to cause dummy dielectric layer 122 to bend toward staircase structure 111 in outer region 112.

As shown in FIG. 1B, polycrystalline silicon (polysilicon) and a metal material (e.g., tungsten) are subsequently deposited into slit openings 126 to form a lower portion 128 and an upper portion 132 of each source contact. As used herein, the "upper end"/"upper portion" of a component (e.g., a source contact) is the end/portion farther away from substrate 102 in the y-direction, and the "lower end"/"lower portion" of a component (e.g., a source contact) is the end/portion closer to substrate 102 in the y-direction when substrate 102 is positioned in the lowest plane of 3D memory device 100. Prior to depositing polysilicon, ion implantation and thermal annealing processes are performed to form doped areas (not shown) in parts of substrate 102 exposed by slit openings 126, which can further exacerbate the dishing toward staircase structure 111. During the deposition process of tungsten to form upper portions 132 of source contacts, a source conductor layer 130 is formed on dummy dielectric layer 122, which also has a dished bottom surface toward staircase structure 111 in outer region 112 of memory stack 104.

Source conductor layer 130 is then planarized by a CMP process. As shown in FIG. 1C, the part of source conductor layer 130 right above inner region 110 of memory stack 104 is completely removed by the CMP process to form source contacts 134 each extending vertically through inner region 110 of memory stack 104. Conversely, the part of source conductor layer 130 bending toward staircase structure 111 in outer region 112 of memory stack 104 cannot be fully removed by the CMP process due to the dishing at underneath dummy dielectric layer 122, thereby causing the formation of a conductor residual 136 above staircase structure 111. Conductor residual 136 thus blocks the subsequent etch process to form word line contacts 138, which are supposed to be in contact with conductor layers 106 (e.g., functioning as word lines of 3D memory device 100) in staircase structure 111 of memory stack 104.

Various embodiments in accordance with the present disclosure provide a method for forming a 3D memory device without any conductor residual caused by dishing. For example, prior to the slit opening etch process and gate replacement process, an elevating dielectric layer can be added to raise up the downward-bent dummy dielectric layer 122 caused by dishing. The additional thickness of the elevating dielectric layer can compensate for the bending toward the staircase structure. As a result, the source conductor layer subsequently deposited on elevating dielectric layer can be fully removed by planarization processes. In some embodiments, as the elevating dielectric layer is made of a dielectric material, any residual of the elevating dielectric layer would not block the formation of word line contacts as occurred in FIG. 1C. Accordingly, the method disclosed herein can increase the source conductor layer planarization window and solve the conductor residual issue, which is beneficial to word line contact process and memory cell and block function.

Figure 2:
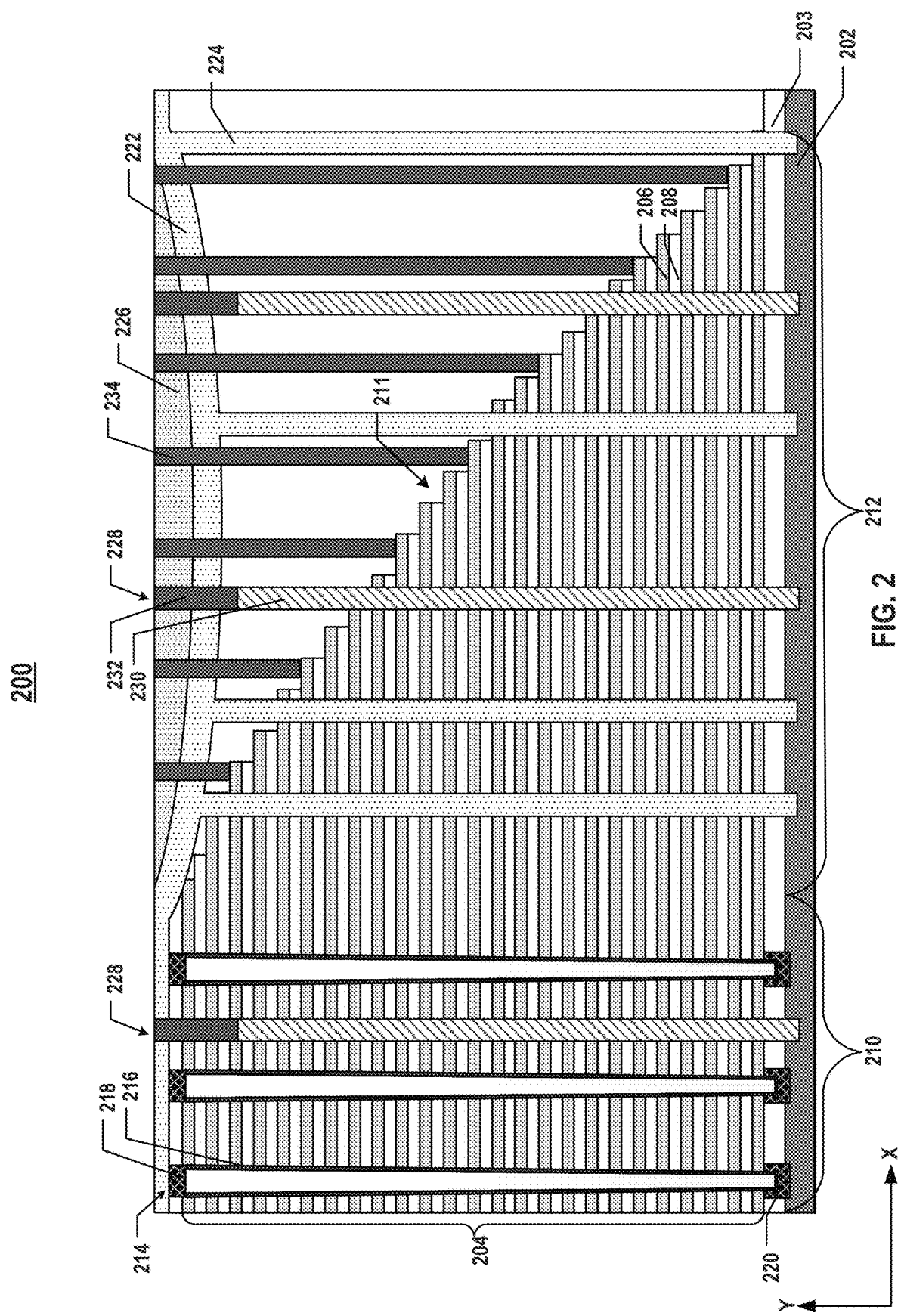
FIG. 2 illustrates a cross-section of an exemplary 3D memory device without conductor residual caused by dishing, according to some embodiments of the present disclosure.

FIG. 2 illustrates a cross-section of an exemplary 3D memory device 200 without conductor residual caused by dishing, according to some embodiments of the present disclosure. 3D memory device 200 can include a substrate 202, which can include silicon (e.g., single crystalline silicon), silicon germanium (SiGe), gallium arsenide (GaAs), germanium (Ge), silicon on insulator (SOI), or any other suitable materials. In some embodiments, substrate 202 is a thinned substrate (e.g., a semiconductor layer), which was thinned from a normal thickness by grinding, wet/dry etching, CMP, or any combination thereof.

3D memory device 200 can include a memory stack 204 above substrate 202. Memory stack 204 can be a stacked storage structure through which memory strings (e.g., NAND memory strings 214) are formed. In some embodiments, memory stack 204 includes a plurality of conductor/dielectric layer pairs stacked vertically above substrate 202. Each conductor/dielectric layer pair can include a conductor layer 206 and a dielectric layer 208. That is, memory stack 204 can include interleaved conductor layers 206 and dielectric layers 208 stacked vertically. As shown in FIG. 2, each NAND memory string 214 extends vertically through interleaved conductor layers 206 and dielectric layers 208 in memory stack 204. In some embodiments, 3D memory device 200 is a NAND Flash memory device in which memory cells are provided at intersections of NAND memory strings 214 and conductor layers 206 (functioning as word lines) of 3D memory device 200. The number of conductor/dielectric layer pairs in memory stack 204 (e.g., 32, 64, 96, or 128) can set the number of memory cells in 3D memory device 200.

Conductor layers 206 can each have the same thickness or have different thicknesses. Similarly, dielectric layers 208 can each have the same thickness or have different thicknesses. Conductor layers 206 can include conductive materials including, but not limited to, tungsten (W), cobalt (Co), copper (Cu), aluminum (Al), polysilicon, doped silicon, silicides, or any combination thereof. Dielectric layers 208 can include dielectric materials including, but not limited to, silicon oxide, silicon nitride, silicon oxynitride, or any combination thereof. In some embodiments, conductor layers 206 include metals, such as tungsten, and dielectric layers 208 include silicon oxide. It is understood that a silicon oxide film 203, such as an in-situ steam generation (ISSG) silicon oxide, is formed between substrate 202 (e.g., a silicon substrate) and memory stack 204, according to some embodiments.

As shown in FIG. 2, memory stack 204 can include an inner region 210 (also known as a "core array region") and an outer region 212 (also known as a "staircase region"). In some embodiments, inner region 210 is the center region of memory stack 204 where an array of NAND memory strings 214 are formed through the conductor/dielectric layer pairs, and outer region 212 is the remaining region of memory stack 204 surrounding inner region 210 (including the sides and edges) without NAND memory strings 214.

As shown in FIG. 2, each NAND memory string 214 can include a channel structure 216 extending vertically through the conductor/dielectric layer pairs in inner region 210 of memory stack 204. Channel structure 216 can include a channel hole filled with semiconductor materials (e.g., forming a semiconductor channel) and dielectric materials (e.g., forming a memory film). In some embodiments, the semiconductor channel includes silicon, such as amorphous silicon, polysilicon, or single crystalline silicon. In some embodiments, the memory film is a composite layer including a tunneling layer, a storage layer (also known as a "charge trap/storage layer"), and a blocking layer. Each NAND memory string 214 can have a cylinder shape (e.g., a pillar shape). The semiconductor channel, tunneling layer, storage layer, and blocking layer are arranged along a direction from the center toward the outer surface of the pillar in this order, according to some embodiments. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high dielectric constant (high-k) dielectrics, or any combination thereof.

In some embodiments, NAND memory strings 214 include a plurality of control gates (each being part of a word line/conductor layer 206) for NAND memory strings 214. Conductor layer 206 in each conductor/dielectric layer pair can function as a control gate for memory cells of NAND memory string 214. Conductor layer 206 can include multiple control gates for multiple NAND memory strings 214 and can extend laterally as a word line ending in outer region 212 of memory stack 204.

In some embodiments, NAND memory string 214 includes two plugs 218 and 220 at a respective end in the vertical direction. Each plug 218 or 220 can be in contact with a respective end of channel structure 216. Plug 220 can include a semiconductor material, such as silicon, that is epitaxially grown from substrate 202. Plug 220 can function as the channel controlled by a source select gate of NAND memory string 214. Plug 220 can be at the lower end of NAND memory string 214 and in contact with channel structure 216. Plug 218 can include semiconductor materials (e.g., polysilicon) or conductor materials (e.g., metals). In some embodiments, plug 218 includes an opening filled with titanium/titanium nitride (Ti/TiN as a barrier layer) and tungsten (as a conductor). By covering the upper end of channel structure 216 during the fabrication of 3D memory device 200, plug 218 can function as an etch stop layer to prevent etching of dielectrics filled in channel structure 216, such as silicon oxide and silicon nitride. In some embodiments, plug 218 functions as the drain of NAND memory string 214.

In some embodiments, 3D memory device 200 further includes source contacts 228. Each source contact 228 in inner region 210 of memory stack 204 can extend vertically through the conductor/dielectric layer pairs in memory stack 204. Source contacts 228 can also extend laterally (e.g., in the x-direction) to separate memory stack 204 into multiple blocks. Source contact 228 can include an opening (slit opening) filled with conductive materials including, but not limited to, W, Co, Cu, Al, silicides, or any combination thereof. Source contact 228 can further include a spacer (not shown) having dielectric materials, such as silicon oxide, laterally between the filled conductive materials and memory stack 204 to electrically insulate the filled conductive materials from surrounding conductor layers 206 in memory stack 204. As a result, source contacts 228 can separate 3D memory device 200 into multiple memory blocks and/or memory fingers.

In some embodiments, each source contact 228 in inner region 210 is shared by multiple NAND memory strings 214 in the same memory block or the same memory finger that share the same array common source (ACS). Source contact 228 can thus be referred to as a "common source contact" of multiple NAND memory strings 214. In some embodiments, substrate 202 includes a doped area (not shown, including p-type or n-type dopants at a desired doping level), and the lower end of source contact 228 is in contact with the doped area of substrate 202. Source contact 228 in inner region 210 thus can electrically connect to a source (e.g., ACS) of NAND memory strings 214 by the doped area. As shown in FIG. 2, each source contact 228 can include a lower portion 230 and an upper portion 232 filled with two different conductive materials to adjust and balance the stress and conductivity of source contacts 228. In some embodiments, lower portion 230 of source contact 228 includes polysilicon, and upper portion 232 of source contact 228 includes a metal, such as tungsten.

As shown in FIG. 2, at least on one side in the lateral direction (e.g., in the x-direction), outer region 212 of memory stack 204 can include a staircase structure 211. That is, memory stack 204 includes staircase structure 211 at one edge of memory stack 204, according to some embodiments. In some embodiments, another staircase structure (not shown) is disposed on the opposite side of memory stack 204 in the x-direction. Each "level" of staircase structure 211 can include one or more conductor/dielectric layer pairs, each including conductor layer 206 and dielectric layer 208. The top layer in each level of staircase structure 211 can be conductor layer 206 for interconnection in the vertical direction. In some embodiments, each two adjacent levels of staircase structure 211 are offset by a nominally same distance in the vertical direction and a nominally same distance in the lateral direction. For each two adjacent levels of staircase structure 211, the first level (and conductor layer and dielectric layer therein) that is closer to substrate 202 can extend laterally further than the second level (and conductor layer and dielectric layer therein), thereby forming a "landing area" on the first level for interconnection in the vertical direction.

Staircase structure 211 can be used for landing word line contacts 234 and/or for balancing load in certain processes during fabrication (e.g., etching and CMP) by dummy channel structures 224 therethrough. The lower end of each word line contact 234 can be in contact with conductor layer 206 (word line) in a respective level of staircase structure 211 to individually address a corresponding word line of 3D memory device 200. Word line contact 234 can be formed by forming an opening (e.g., a via hole or a trench) extending vertical through one or more dielectric layers and filling the opening with conductive materials including, but not limited to, W, Co, Cu, Al, silicides, or any combination thereof.

In some embodiments, 3D memory device 200 further includes dummy channel structures 224. Dummy channel structure 224 can extend vertically through memory stack 204 and is formed by filling a vertical opening (e.g., a dummy channel hole) with dielectric materials including, but not limited to, silicon oxide, silicon nitride, silicon oxynitride, or any combination thereof. It is understood that in some embodiments, dummy channel structures 224 are formed in the same deposition processes as channel structures 216 and thus, have the same materials as those in channel structures 216. Different from channel structures 216, a contact is not formed on each dummy channel structure 224 to avoid electrical connections with other components of 3D memory device 200, according to some embodiments. Thus, dummy channel structures 224 cannot be used for forming memory cells in 3D memory device 200. Instead, dummy channel structures 224 can provide mechanical support to the memory array structures, e.g., memory stack 204. In some embodiments, each dummy channel structure 224 is fully filled with a dielectric material, such as a silicon oxide layer, and extends vertically through the conductor/dielectric layer pairs in memory stack 204, either in inner region 210 or in outer region 212 in memory stack 204.

In some embodiments, 3D memory device 200 further includes a first dielectric layer 222 above both inner region 210 and outer region 212 of memory stack 204. First dielectric layer 222 can be formed in the same deposition process for forming dummy channel structures 224 and thus, includes the same dielectric material as dummy channel structures 224 (e.g., silicon oxide). That is, dummy channel structure 224 can be filled with first dielectric layer 222, and first dielectric layer 222 extends over the field surrounding the dummy channel holes and inside the dummy channel holes. First dielectric layer 222 can thus be referred to herein as a "dummy dielectric layer" as well. As shown in FIG. 2, part of dummy dielectric layer 222 right above staircase structure 211 in outer region 212 of memory stack 204 can have a dished bottom surface due to the dishing effect as described above in detail. In some embodiments, dishing occurs at the part of dummy dielectric layer 222 right above staircase structure 211 only, but not the part of dummy dielectric layer right above inner region 210 of memory stack 204, which still have a nominally flat bottom surface.

In some embodiments, 3D memory device 200 further includes a second dielectric layer 226 on the part of dummy dielectric layer 222 right above staircase structure 211 in outer region 212 of memory stack 204. As will be described below in detail, second dielectric layer 226 may be a residual of an elevating dielectric layer formed on dummy dielectric layer 222 after the elevating dielectric layer is planarized and thus, is referred to herein as a "residual elevating dielectric layer" as well. Due to the dishing effect, residual elevating dielectric layer 226 may remain on the part of dummy dielectric layer 222 right above staircase structure 211 as dummy dielectric layer 222 bends toward staircase structure 211 after planarizing the elevating dielectric layer. Thus, residual elevating dielectric layer 226 has a nominally flat top surface (e.g., by CMP process) and a bent bottom surface profile matching the dished portion of dummy dielectric layer 222 at the interface between dummy dielectric layer 222 and residual elevating dielectric layer 226, according to some embodiments.

In some embodiments, residual elevating dielectric layer 226 includes dielectrics, such as silicon oxide, silicon nitride, silicon oxynitride, or any combination thereof. In one example, residual elevating dielectric layer 226 includes silicon oxide, such as tetraethyl orthosilicate (TEOS) formed on dummy dielectric layer 222 by chemical vapor deposition (CVD). In another example, residual elevating dielectric layer 226 includes spin-on dielectric (SOD), such as spin-on silicon oxide, formed on dummy dielectric layer 222 by spin-coating. In some embodiments, residual elevating dielectric layer 226 and dummy dielectric layer 222 include different dielectric materials. Residual elevating dielectric layer 226 and dummy dielectric layer 222 can include the same dielectric material(s), such as silicon oxide. It is understood that, although the above-described 3D memory device 200 includes individual dummy dielectric layer 222 and residual elevating dielectric layer 226, respectively, these individual layers may not be discernible or distinguishable from each other in 3D memory device 200 after complete fabrication of 3D memory device 200, particularly if dummy dielectric layer 222 and residual elevating dielectric layer 226 include the same dielectric material, such as silicon oxide.

As will be described below in detail, by adding an elevating dielectric layer to raise up the dielectric subject to dishing before forming the source conductor layer, 3D memory device 200 is free of any source conductor residual that covers staircase structure 211 and blocks the etching of contact holes of word line contacts 234. Different from conductor residual 136 in FIG. 1C, which is made of a conductive material, residual elevating dielectric layer 226 is made of a dielectric material. Word line contacts 234 can be formed extending vertically through residual elevating dielectric layer 226 and the part of dummy dielectric layer 222 right above staircase structure 211 to contact conductor layers 206 (word lines) in staircase structure 211 in outer region 212 of memory stack 204.

It is understood that 3D memory device 200 can include additional components and structures not shown in FIG. 2 including, but not limited to, other local contacts and interconnects in one or more middle-end-of-line (MEOL) and back-end-of-line (BEOL) interconnect layers above memory stack 204 and/or below substrate 202, and peripheral devices, such as any suitable digital, analog, and/or mixed-signal peripheral circuits used for facilitating the operation of 3D memory device 200.

FIGS. 3A-3H illustrate an exemplary fabrication process for forming a 3D memory device without conductor residual caused by dishing, according to some embodiments of the present disclosure. FIG. 4 is a flowchart of an exemplary method 400 for forming a 3D memory device without conductor residual caused by dishing, according to some embodiments. Examples of the 3D memory device depicted in FIGS. 3A-3H and 4 include 3D memory device 200 depicted in FIG. 2. FIGS. 3A-3H and 4 will be described together. It is understood that the operations shown in method 400 are not exhaustive and that other operations can be performed as well before, after, or between any of the illustrated operations. Further, some of the operations may be performed simultaneously, or in a different order than shown in FIG. 4.

Referring to FIG. 4, method 400 starts at operation 402, in which a channel structure extending vertically through a dielectric stack including interleaved sacrificial layers and dielectric layers is formed above a substrate. In some embodiments, the dielectric stack including a plurality of dielectric/sacrificial layer pairs is formed above the substrate. The substrate can be a silicon substrate. In some embodiments, a staircase structure is formed at one edge of the dielectric stack.

Figure 3A:
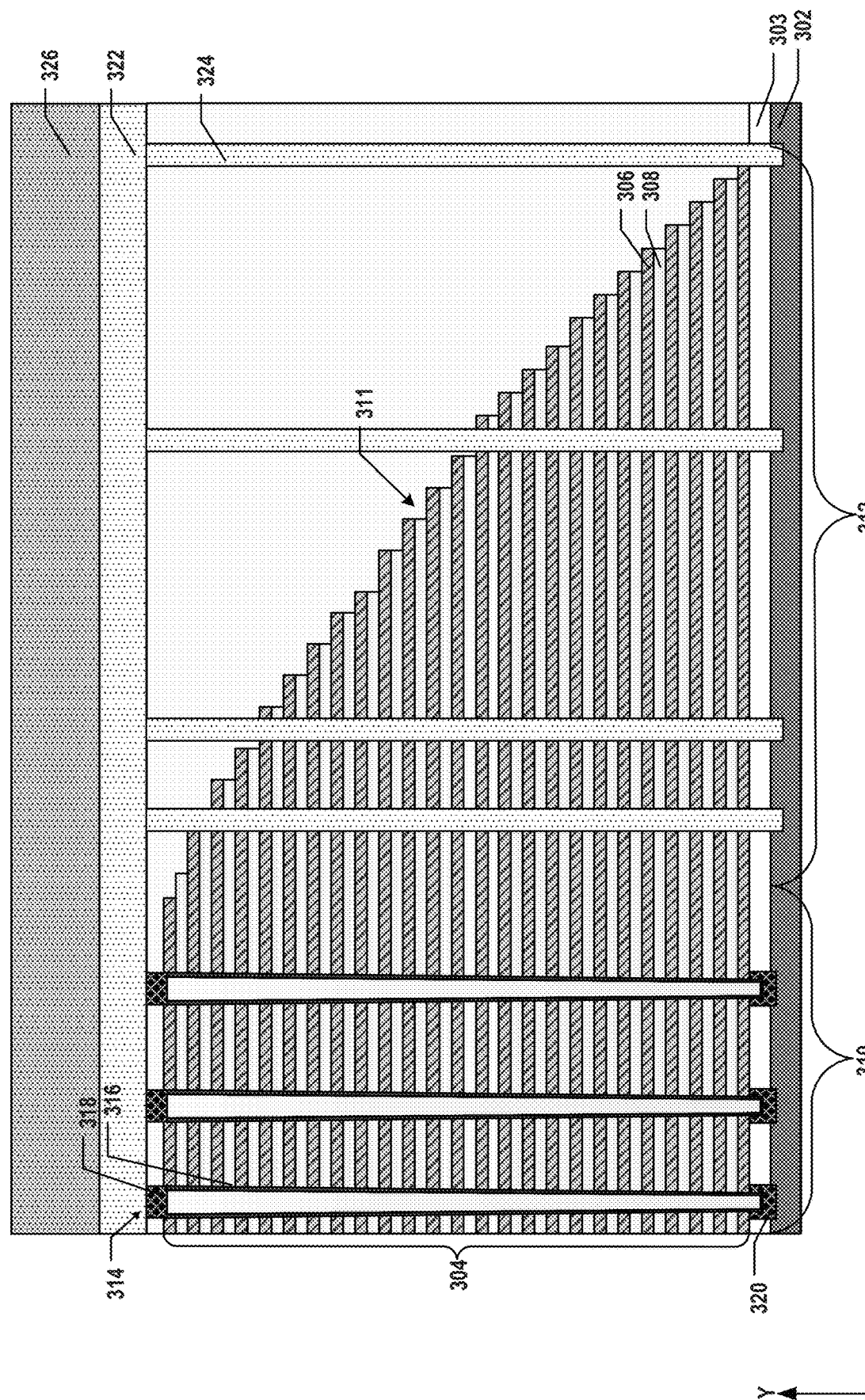
FIGS. 3A-3H illustrate an exemplary fabrication process for forming a 3D memory device without conductor residual caused by dishing, according to some embodiments of the present disclosure.
Figure 4:
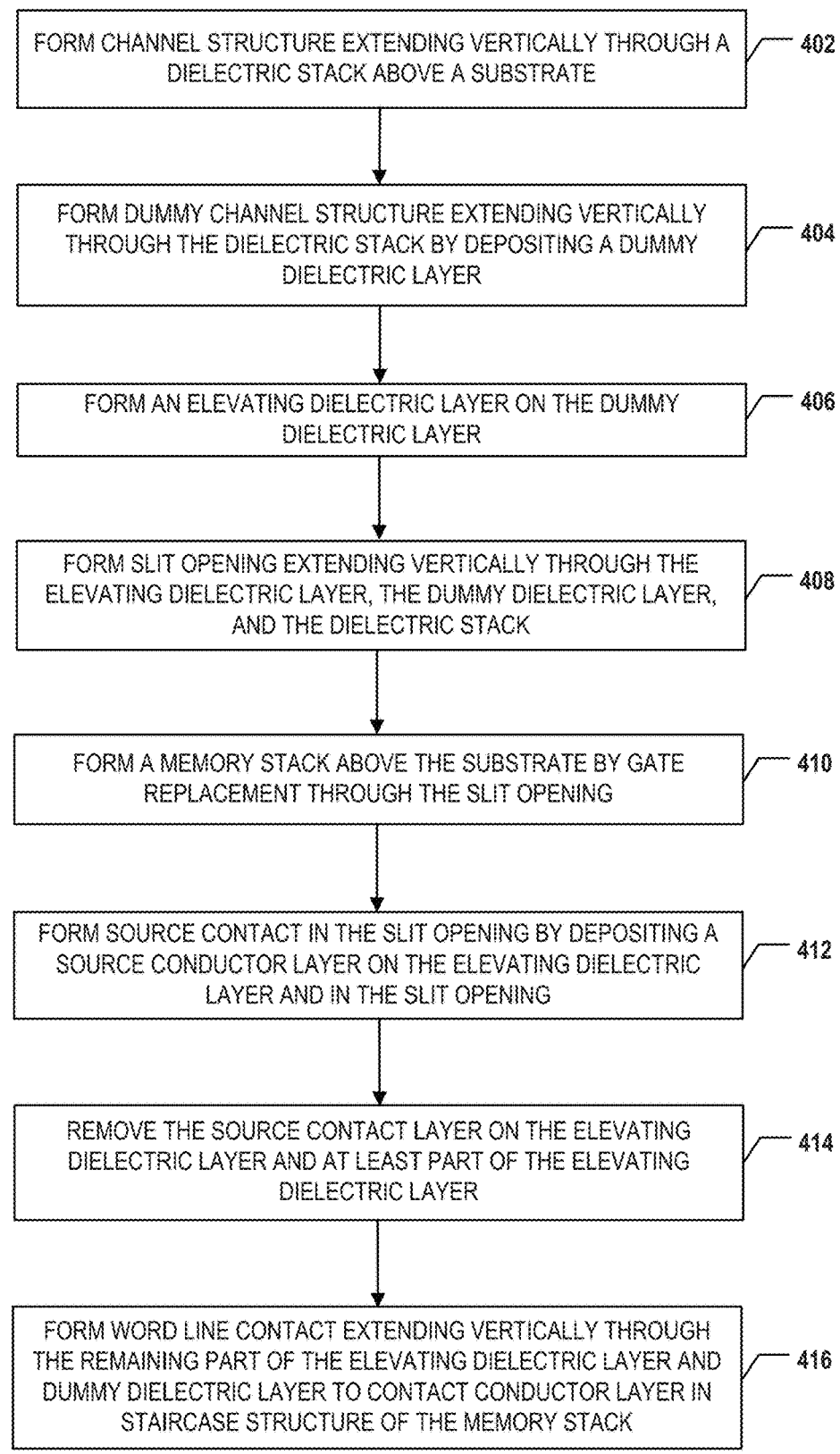
FIG. 4 is a flowchart of an exemplary method for forming a 3D memory device without conductor residual caused by dishing, according to some embodiments.

As illustrated in FIG. 3A, a dielectric stack 304 including a plurality of dielectric/sacrificial layer pairs is formed above a silicon substrate 302. In some embodiments, sacrificial layers 306 and dielectric layers 308 are alternatingly deposited by one or more thin film deposition processes including, but not limited to, physical vapor deposition (PVD), CVD, atomic layer deposition (ALD), or any combination thereof. In some embodiments, sacrificial layers 306 include silicon nitride, and dielectric layers 308 include silicon oxide. It is understood that the sequence of depositing sacrificial layers 306 and dielectric layers 308 is not limited to any particular order. The deposition can start with sacrificial layer 306 or dielectric layer 308 and can end with sacrificial layer 306 or dielectric layer 308. In some embodiments, a silicon oxide film 303, such as an ISSG silicon oxide, is formed on silicon substrate 302 prior to forming dielectric stack 304.

As illustrated in FIG. 3A, staircase structures 311 are formed on the sides of dielectric stack 304. Staircase structure 311 can be formed by the so-called "trim-etch" processes, which, in each cycle, trim (e.g., etching incrementally and inwardly, often from all directions) a patterned photoresist layer, followed by etching the exposed portions of the dielectric/sacrificial layer pair using the trimmed photoresist layer as an etch mask to form one step of staircase structure 311. Dielectric stack 304 thus can include an outer region 312 including staircase structure 311 and an inner region 310 in which NAND memory strings 314 can be formed.

As illustrated in FIG. 3A, an array of NAND memory strings 314 are formed. Each NAND memory string 314 can include a channel structure 316 extending vertically through interleaved sacrificial layers 306 and dielectric layers 308 in dielectric stack 304. In some embodiments, fabrication processes to form channel structure 316 include forming a channel hole through interleaved sacrificial layers 306 and dielectric layers 308 in dielectric stack 304 using dry etching/and or wet etching, such as deep reactive-ion etching (DRIE), followed by filling the channel hole with a plurality of layers, such as a dielectric layer and a semiconductor layer, using thin film deposition processes. In some embodiments, the dielectric layer is a composite dielectric layer, such as a combination of multiple dielectric layers including, but not limited to, a tunneling layer, a storage layer, and a blocking layer. The tunneling layer can include dielectric materials including, but not limited to, silicon oxide, silicon nitride, silicon oxynitride, or any combination thereof. The storage layer can include materials for storing charge for memory operation. The storage layer materials can include, but not limited to, silicon nitride, silicon oxynitride, a combination of silicon oxide and silicon nitride, or any combination thereof. The blocking layer can include dielectric materials including, but not limited to, silicon oxide or a combination of silicon oxide/silicon oxynitride/silicon oxide (ONO). The blocking layer can further include a high-k dielectric layer, such as an aluminum oxide ($Al_2O_3$) layer. The semiconductor layer can include polysilicon, serving as a semiconductor channel. The semiconductor layer and dielectric layer can be formed by processes such as ALD, CVD, PVD, or any combination thereof.

As illustrated in FIG. 3A, each NAND memory string 314 further includes a plug 318 at its upper end and a plug 320 at its lower end. Plug 320 can be epitaxially grown from silicon substrate 302 in the lower portion of the channel hole before forming channel structure 316. In some embodiments, plug 318 is formed by etching back the materials in the upper portion of channel structure 316, followed by depositing semiconductor materials, such as polysilicon, using one or more deposition processes such as ALD, CVD, PVD, or any combination thereof.

Method 400 proceeds to operation 404, as illustrated in FIG. 4, in which a dummy channel structure extending vertically through the dielectric stack is formed by depositing a dummy dielectric layer on the dielectric stack and in a dummy channel hole. As illustrated in FIG. 3A, an array of dummy channel structures 324 are formed through dielectric stack 304. Dummy channel structure 324 can be formed by first etching an opening (dummy channel hole) through dielectric stack 304 and/or one or more dielectric layers using wet etching and/or dry etching, such as DRIE. In some embodiments, the dummy channel hole is then fully filled with dielectrics, such as a silicon oxide, by depositing a dummy dielectric layer 322 in the dummy channel hole as well as on the field of the dummy channel hole (i.e., on the top surface of dielectric stack 304) using thin film deposition processes such as ALD, CVD, PVD, or any combination thereof. Although not shown in FIG. 3A, it is understood that in some embodiments, dummy channel structures 324 are formed simultaneously with channel structures 316 through dielectric stack 304 in the same fabrication steps, such that the dummy channel hole of each dummy channel structure 324 is filled with at least some of the materials filling in channel structures 316.

Method 400 proceeds to operation 406, as illustrated in FIG. 4, in which an elevating dielectric layer is formed above the dielectric stack. In some embodiments, the elevating dielectric layer is formed on the dummy dielectric layer. The thickness of the elevating dielectric layer is not less than about 100 nm, such as between about 100 nm and about 300 nm, according to some embodiments. In some embodiments, the elevating dielectric layer includes silicon oxide. In some embodiments, to form the elevating dielectric layer, a SOD is spin-coated. In some embodiments, the dummy dielectric layer and elevating dielectric layer include the same dielectric material.

As illustrated in FIG. 3A, an elevating dielectric layer 326 is formed on dummy dielectric layer 322 above dielectric stack 304. The thickness of elevating dielectric layer 326 is not less than about 100 nm, such as not less than 100 nm, according to some embodiments. In some embodiments, the thickness of elevating dielectric layer 326 is between about 100 nm and about 300 nm, such as between 100 nm and 300 nm (e.g., 100 nm, 120 nm, 140 nm, 150 nm, 160 nm, 180 nm, 200 nm, 220 nm, 240 nm, 250 nm, 260 nm, 280 nm, 300 nm, any range bounded by the lower end by any of these values, or in any range defined by any two of these values). As described below in detail with reference to FIGS. 3C and 3D, the thickness of elevating dielectric layer 326 is sufficient to raise up the bottom surface of a source conductor layer 332 to be deposited on the top surface of elevating dielectric layer 326 to a certain level when dishing occurs at dummy dielectric layer 322 and elevating dielectric layer 326, such that source conductor layer 332 can be fully removed by planarization processes.

In some embodiments, elevating dielectric layer 326 is formed by depositing dielectric materials, such as silicon oxide, using one or more deposition processes such as ALD, CVD, PVD, or any combination thereof. For example, elevating dielectric layer 326 is deposited on dummy dielectric layer 322 using a TEOS-based CVD process. In some embodiments, elevating dielectric layer 326 is formed by spin-coating SOD materials, e.g., silicon oxide, on dummy dielectric layer 322. Spin-coating is a procedure that involves evaporating a coating material onto the wafer and then spinning it at high speed to make it spread thin. In some embodiments, dummy dielectric layer 322 and elevating dielectric layer 326 are formed by depositing the same dielectric material, such as silicon oxide. It is understood that dummy dielectric layer 322 and elevating dielectric layer 326 can be formed in a single process, and the overall thickness of deposited dielectric layer is not less than about 100 nm, such as between about 100 nm and about 300 nm.

Figure 3B:
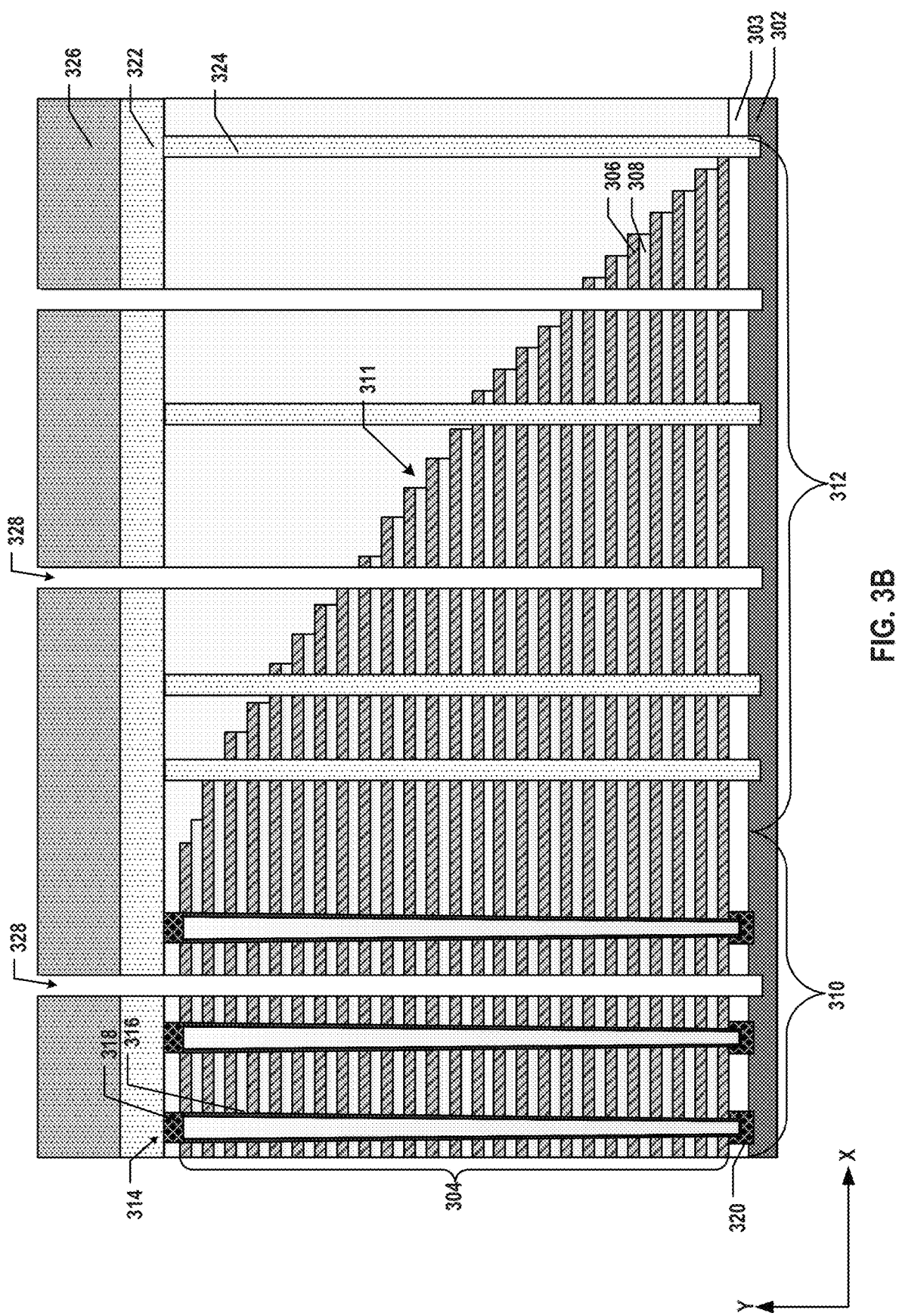

Method 400 proceeds to operation 408, as illustrated in FIG. 4, in which a slit opening extending vertically through the elevating dielectric layer, the dummy dielectric layer, and the dielectric stack, is formed. As illustrated in FIG. 3B, slit openings 328 are etched through elevating dielectric layer 326, dummy dielectric layer 322, and the dielectric/sacrificial layer pairs in dielectric stack 304 to reach silicon substrate 302. Slit openings can be formed by wet etching and/or dry etching of dielectrics (e.g., silicon oxide and silicon nitride), for example, using DRIE process. Slit openings 328 can be formed in both inner region 310 and outer region 312 of dielectric stack 304.

Method 400 proceeds to operation 410, as illustrated in FIG. 4, in which a memory stack including interleaved conductor layers and the dielectric layers is formed above the substrate by replacing, through the slit opening, the sacrificial layers with the conductor layers. In some embodiments, the memory stack includes a staircase structure at one edge of the memory stack, which is formed from the staircase structure of the dielectric stack. After forming the memory stack, dishing occurs at a part of the elevating dielectric layer and the dummy dielectric layer right above the staircase structure, and a top surface of the part of the elevating dielectric layer right above the staircase structure is above a top surface of another part of the dummy dielectric layer outside the staircase structure, according to some embodiments.

Figure 3C:
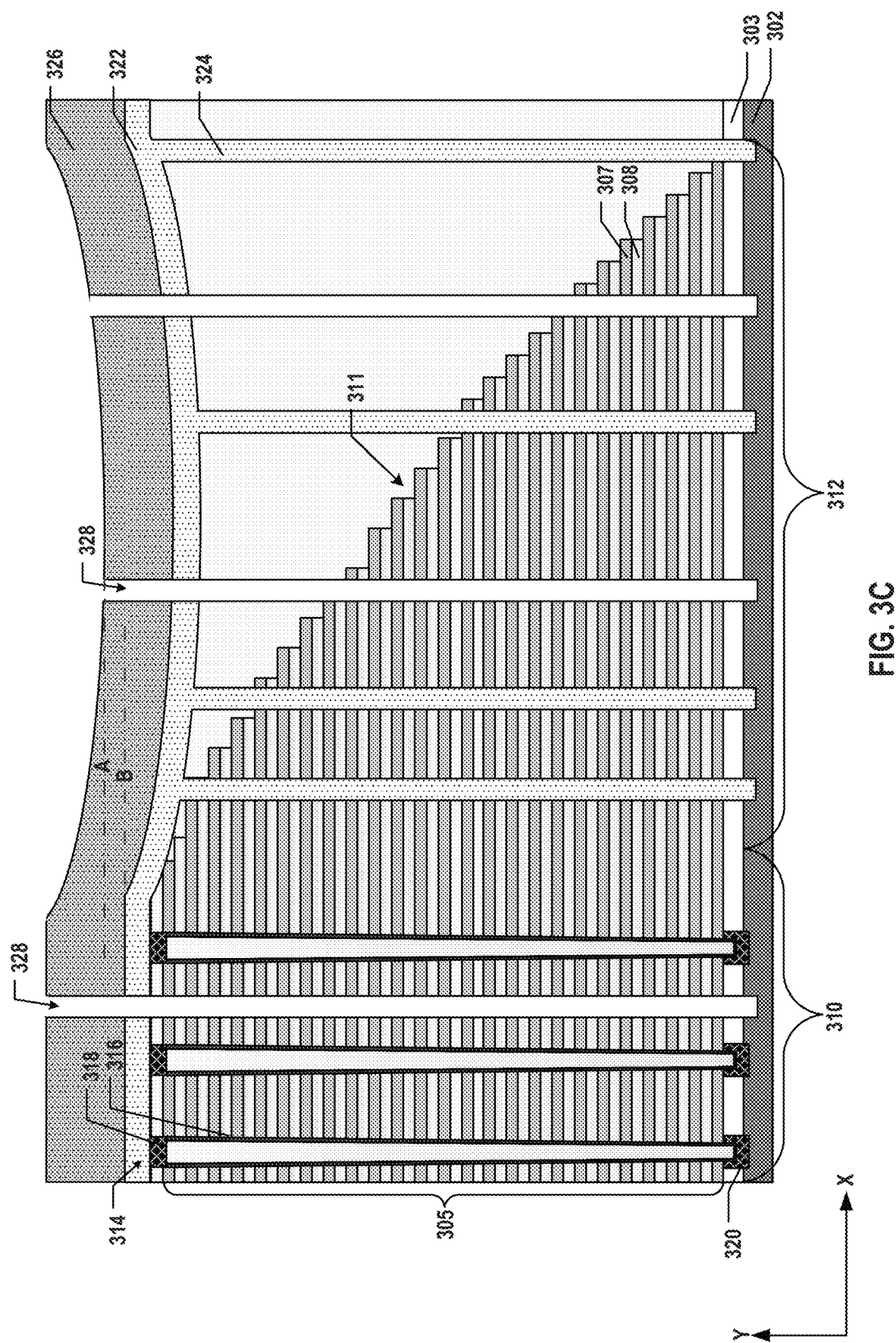
Figure 3D:
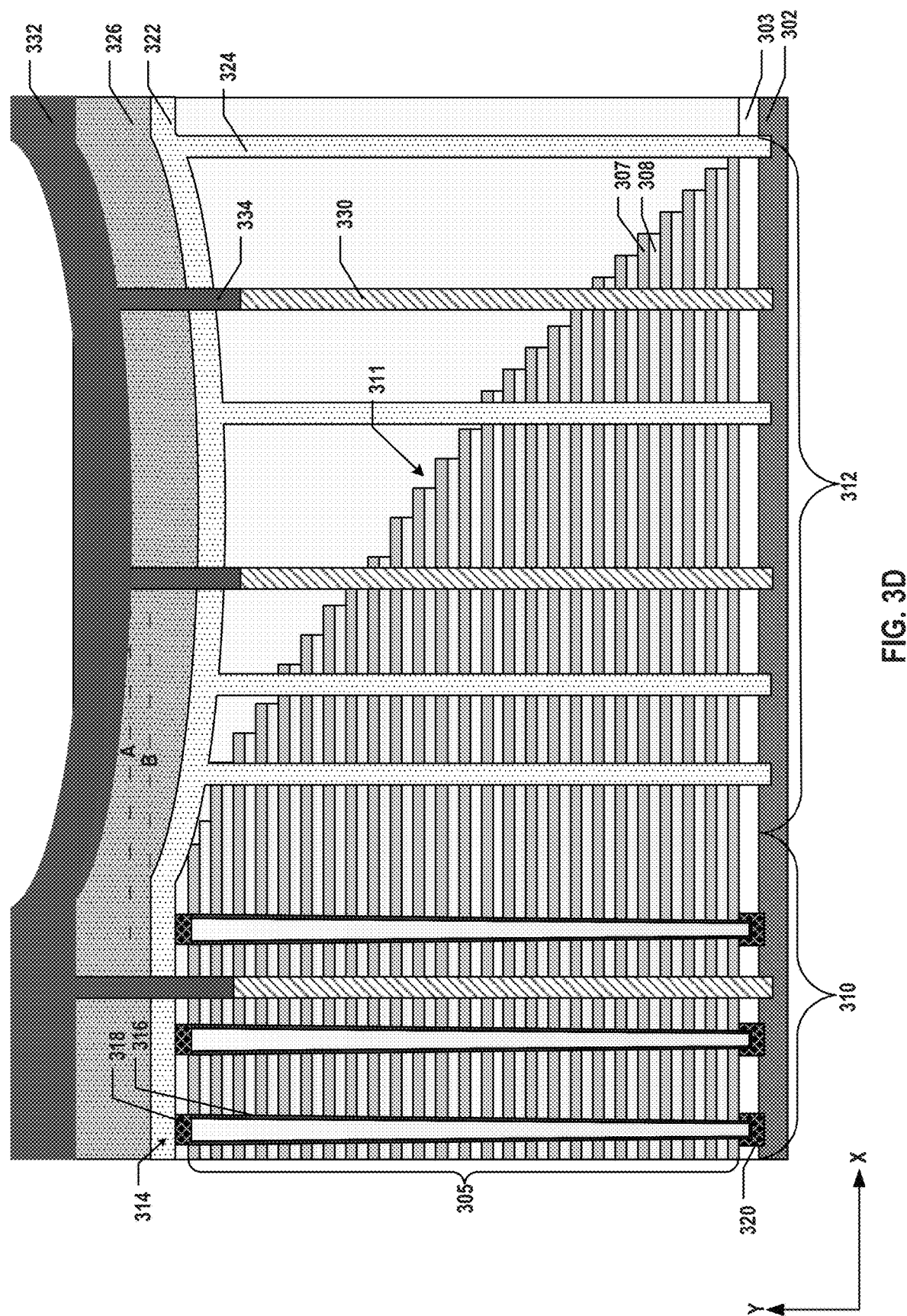

As illustrated in FIG. 3C, slit opening 328 formed in inner region 310 of dielectric stack 304 can be used as the pathway for gate replacement processes that replace sacrificial layers 306 in dielectric stack 304 (as shown in FIG. 3B) with conductor layers 307 to form a plurality of conductor/dielectric layer pairs. The replacement of sacrificial layers 306 with conductor layers 307 can be performed by wet etching sacrificial layers 306 (e.g., silicon nitride) selective to dielectric layers 308 (e.g., silicon oxide) and filling the structure with conductor layers 307 (e.g., tungsten). Conductor layers 307 can be deposited by PVD, CVD, ALD, electrochemical depositions, or any combination thereof. Conductor layers 307 can include conductive materials including, but not limited to, W, Co, Cu, Al, polysilicon, silicides, or any combination thereof. As a result, after the gate replacement processes, dielectric stack 304 in FIGS. 3A and 3B becomes memory stack 305 including the conductor/dielectric layer pairs, i.e., interleaved conductor layers 307 and dielectric layers 308, on silicon substrate 302. Memory stack 305 can also include staircase structure 311 on one edge thereof as well as inner region 310 and outer region 312, just like dielectric stack 304.

As described above in detail, the formation of slit openings 328 and memory stack 305 (e.g., the etching of slit openings 328 and gate replacement process) can induce dishing to occur at dielectric(s) (e.g., dummy dielectric layer 322 and elevating dielectric layer 326) right above staircase structure 311 in outer region 312, which causes the dielectric(s) (e.g., dummy dielectric layer 322 and elevating dielectric layer 326) to bend downward (i.e., toward staircase structure 311). That is, after forming memory stack 305, dishing can occur at part of dummy dielectric layer 322 and elevating dielectric layer 326 right above staircase structure 311. Consequently, the top surface of the part of elevating dielectric layer 326 and the bottom surface of the part of dummy dielectric layer 322 become dished (curved) surfaces. In order to ensure that source conductor layer 332 to be deposited on the top surface of elevating dielectric layer 326 can be fully removed by planarization process, as shown in FIG. 3C, the top surface ("A") (e.g., the lowest point of the top surface) of the part of elevating dielectric layer 326 right above staircase structure 311 is above the top surface ("B") of another part of dummy dielectric layer 322 outside staircase structure 311 (i.e., in inner region 310).

Method 400 proceeds to operation 412, as illustrated in FIG. 4, in which a source contact is formed in the slit opening by depositing a source conductor layer on the elevating dielectric layer and in the slit opening. In some embodiments, to form the source contact, a lower portion of the source contact is formed by depositing polysilicon into the slit opening, and an upper portion of the source contact is formed by depositing the source conductor layer into the slit opening.

As illustrated in FIG. 3D, lower portions 330 of source contacts are formed by filling (e.g., depositing) polysilicon into slit openings 328 (as shown in FIG. 3C) by PVD, CVD, ALD, electrochemical depositions, or any combination thereof. Upper portions 334 of source contacts can be formed by filling (e.g., depositing) a source conductor layer 332 into slit openings 328 as well as on the field of slit openings 328 (i.e., on elevating dielectric layer 326) by PVD, CVD, ALD, electrochemical depositions, or any combination thereof. Source conductor layer 332 can include conductive materials including, but not limited to, metals (e.g., W, Co, Cu, Al, etc.), polysilicon, silicides, or any combination thereof. In some embodiments, a dielectric layer (e.g., a silicon oxide layer) is formed on the sidewalls of slit openings 328 as spacers to electrically isolate upper and lower portions 330 and 334 of source contacts from surrounding conductor layers 307 in memory stack 305. The lower end of lower portion 330 of each source contact can be in contact with a doped area (not shown), which can be formed in silicon substrate 302 using ion implantation, followed by thermal annealing. It is understood that in some embodiments, lower portions 330 of source contacts are not formed in slit openings 328, and source conductor layer 332 (e.g., a tungsten layer) fully fills slit openings (with the spacers).

As illustrated in FIG. 3D, as source conductor layer 332 is deposited directly on elevating dielectric layer 326, the bottom surface ("A") of the part of source conductor layer 332 right above staircase structure 311 overlaps with the dished top surface ("A") of the part of elevating dielectric layer 326 right above staircase structure 311. Thus, the bottom surface ("A") of the part of source conductor layer 332 right above staircase structure 311 is also above the top surface ("B") of the other part of dummy dielectric layer 322 outside staircase structure 311 (i.e., in inner region 310), which ensures that when planarization processes stop at or below the top surface ("B") of dummy dielectric layer 322, source conductor layer 332 can be fully removed without any residual. It is understood that in some cases, the processes in forming the source contacts (e.g., thermal annealing) may exacerbate the dielectric dishing right above staircase structure 311, which lowers the dished bottom surface ("A") of source conductor layer 332. Thus, after the formation of source contacts, the bottom surface ("A") of the part of source conductor layer 332 right above staircase structure 311 needs to be still above the top surface ("B") of the other part of dummy dielectric layer 322 outside staircase structure 311 (i.e., in inner region 310) in order to ensure the free of conductor residual, according to some embodiments.

Method 400 proceeds to operation 414, as illustrated in FIG. 4, in which the source conductor layer on the elevating dielectric layer and at least a part of the elevating dielectric layer are removed. In some embodiments, at least a part of the source conductor layer is removed to expose the underneath elevating dielectric layer by planarizing the source conductor layer, for example, using CMP. In some embodiments, at least a part of the elevating dielectric layer is then removed by etching the elevating dielectric layer, for example, using wet etching. In some embodiments, the remaining part of the source conductor layer is fully removed by planarizing the source conductor layer, for example, using CMP again.

Figure 3E:
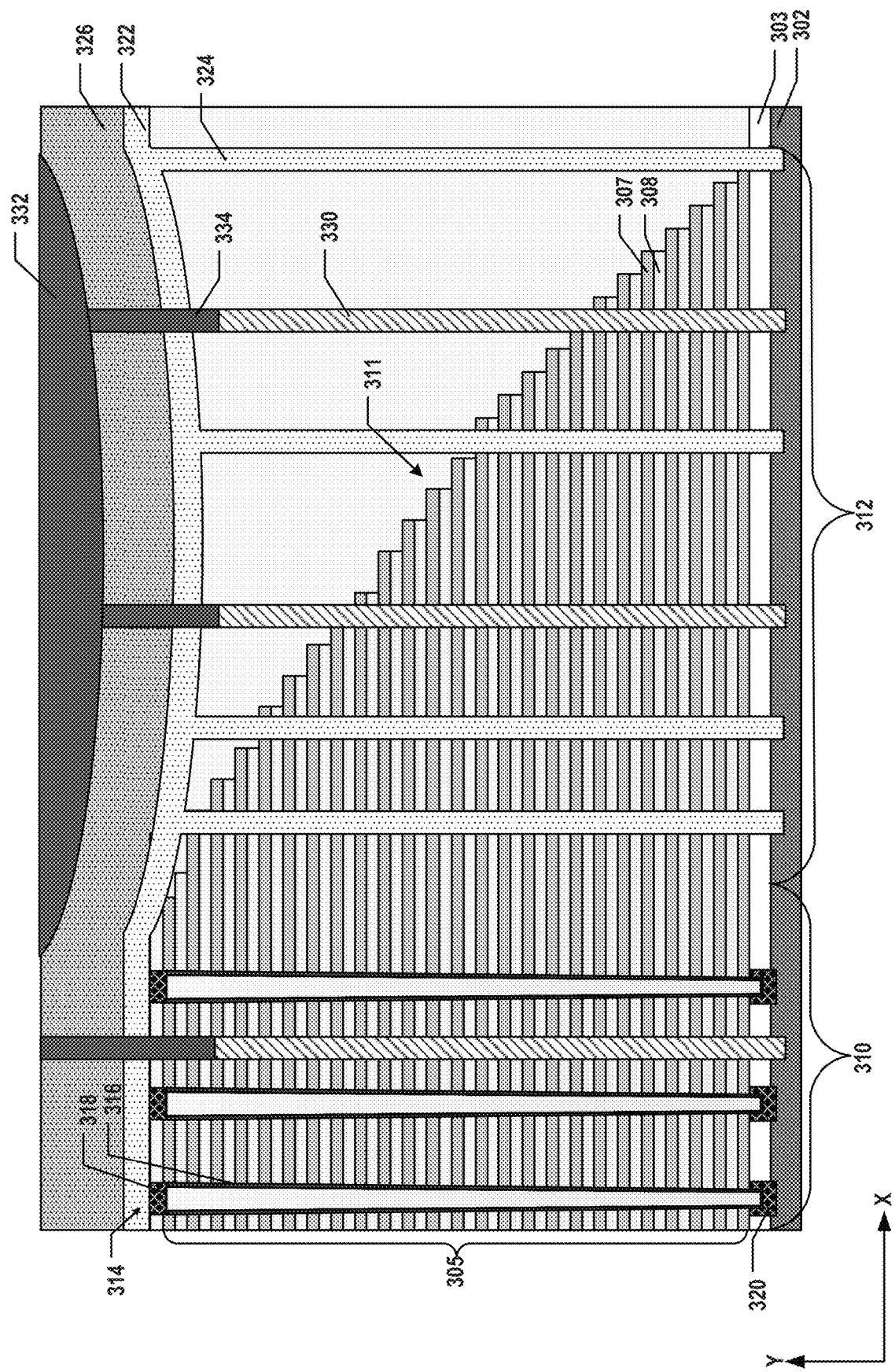

As illustrated in FIG. 3E, at least a part of source conductor layer 332 is removed by planarizing source conductor layer 332 using CMP. CMP is a process of smoothing surfaces with the combination of chemical and mechanical forces using an abrasive and corrosive chemical slurry (commonly a colloid) in conjunction with a polishing pad and retaining ring. The CMP process can be metal CMP with slurry and other conditions suitable for planarizing the metal material forming source conductor layer 332, such as tungsten. The processing time for CMP can be controlled such that the CMP process can stop when at least a part of elevating dielectric layer 326 is exposed. In some embodiments, the first metal CMP for planarizing source conductor layer 332 does not continue once elevating dielectric layer 326 is exposed to avoid planarizing the dielectric material forming elevating dielectric layer 326 using the slurry and other conditions for metal CMP process.

Figure 3F:
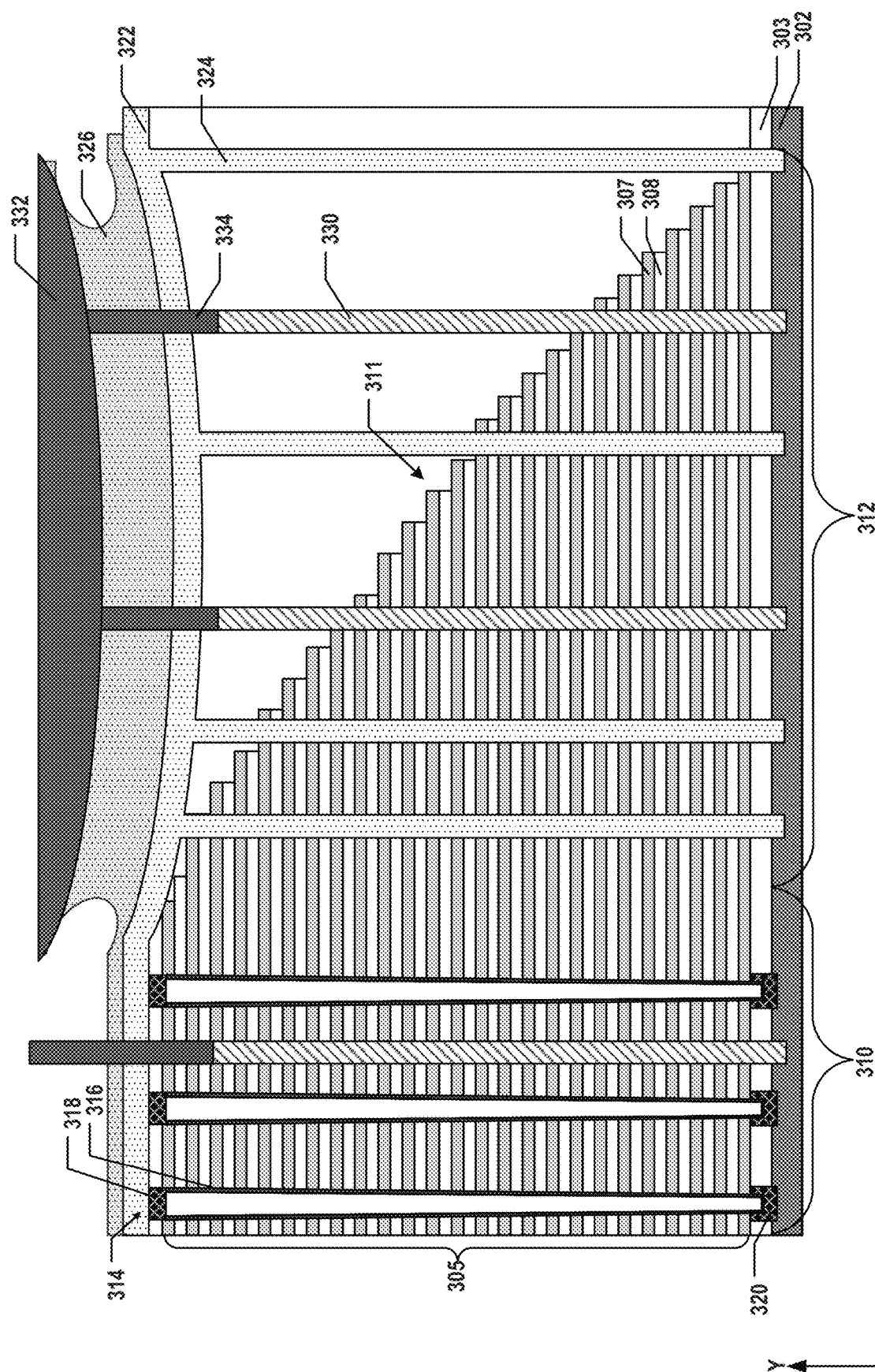

As illustrated in FIG. 3F, at least a part of elevating dielectric layer 326 is then removed by etching elevating dielectric layer 326, for example, using wet etching. Wet etching is a material removal process that uses liquid chemicals or etchants to remove materials from a wafer. Any suitable etchant for etching dielectric material(s) forming elevating dielectric layer 326 can be used to remove part of elevating dielectric layer 326. In some embodiments in which elevating dielectric layer 326 includes silicon oxide, the etchant includes hydrofluoric acid (HF) in any suitable concentration. Wet etching for removing silicon oxide is usually isotropic, which can undercut part of elevating dielectric layer 326 that is still covered by source conductor layer 332, according to some embodiments. The amount of elevating dielectric layer 326 removed by wet etching can be controlled by any suitable etching parameters, such as etchant type, etchant, concentration, etchant temperature, and etching time.

Figure 3G:
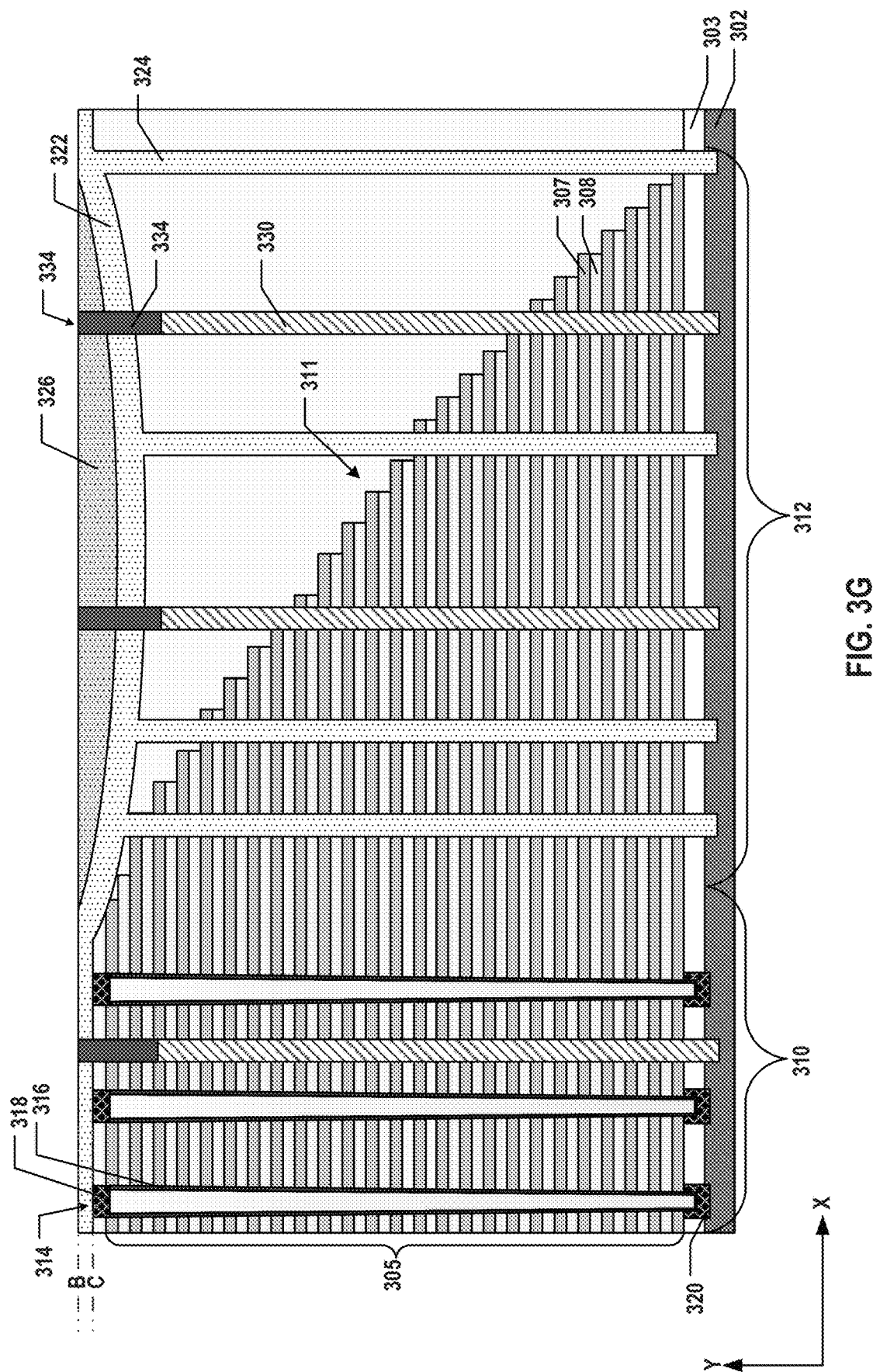

As illustrated in FIG. 3G, the remaining part of source conductor layer 332 (as shown in FIG. 3F) is fully removed by planarizing source conductor layer 332 using CMP again. The second CMP process can be also metal CMP with slurry and other conditions suitable for planarizing the metal material forming source conductor layer 332, such as tungsten. The processing time for CMP can be controlled such that the second CMP process can stop when source conductor layer 332 is fully removed without any residual. In some embodiments, the second CMP process can stop at nominally the top surface ("B") of another part of dummy dielectric layer 322 outside staircase structure 311 (i.e., in inner region 310). It is understood that the second CMP may stop below the top surface ("B"), but above the bottom surface ("C"), of dummy dielectric layer 322. The second CMP process can planarize the remaining elevating dielectric layer 326 as well until the top surface of elevating dielectric layer 326 flushes with the top surface ("B") of dummy dielectric layer 322, i.e., becomes a nominally flat surface. Due to the dishing effect, there may be still residual of elevating dielectric layer 326 that is not removed after the second CMP process, which becomes part of dielectrics right above staircase structure 311.

Figure 3H:
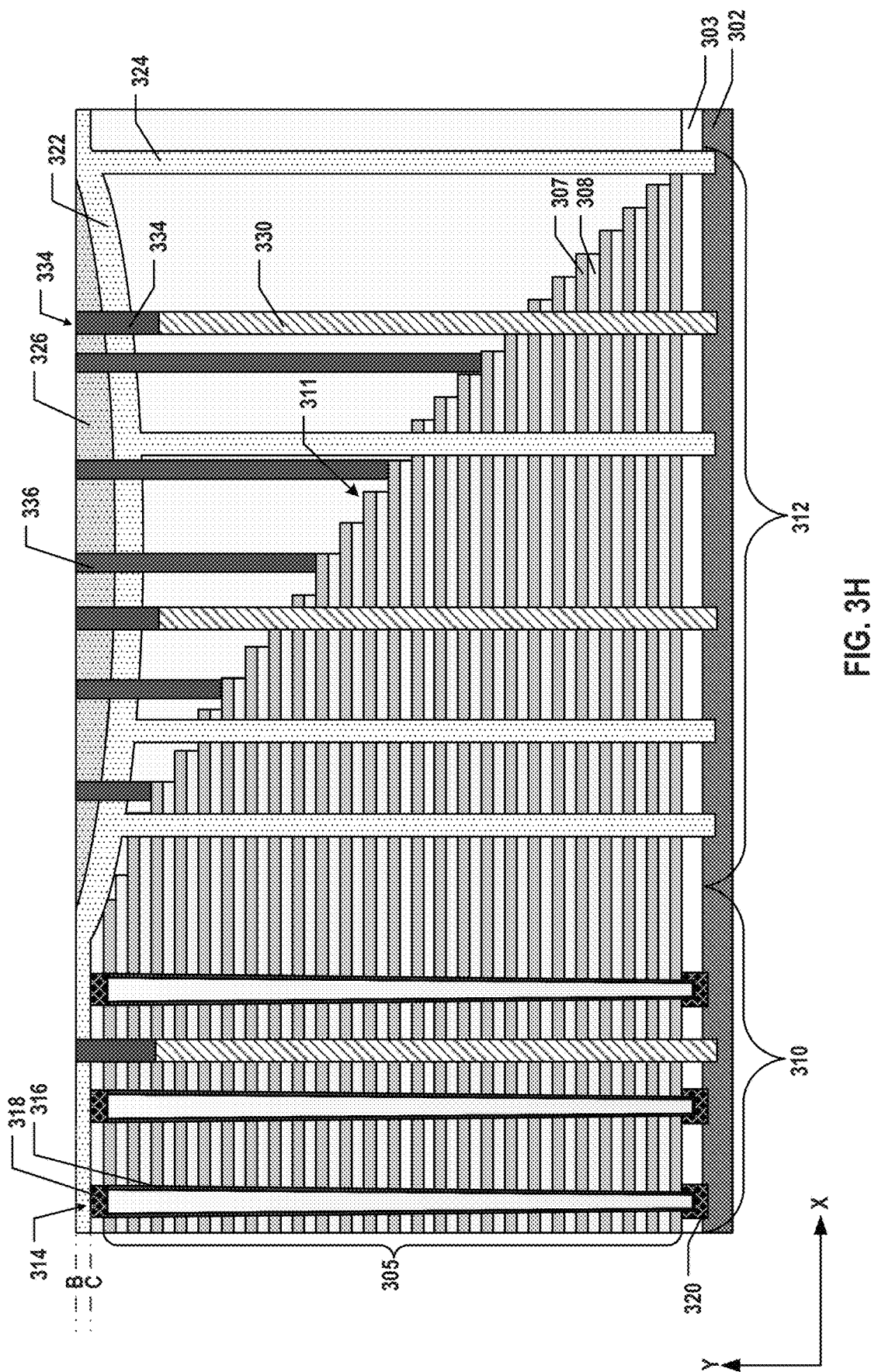

Method 400 proceeds to operation 416, as illustrated in FIG. 4, in which a word line contact extending vertically through the remaining part of the elevating dielectric layer and the dummy dielectric layer to contact one of the conductor layers in the staircase structure of the memory stack. As illustrated in FIG. 3H, word line contacts 336 are formed each through the residual of elevating dielectric layer 326 and dummy dielectric layer 322 right above staircase structure 311. Each word line contact 336 is in contact with a respective one of conductor layers (word lines) 307 of the conductor/dielectric layer pairs in staircase structure 311. Word line contacts 336 are formed through dielectric layers (e.g., residual of elevating dielectric layer 326 and dummy dielectric layer 322) by first etching vertical openings (e.g., by wet etching and/or dry etching), followed by filling the openings with conductive materials using ALD, CVD, PVD, electrochemical depositions, or any combination thereof. In some embodiments, other conductive materials are filled in the openings to function as an adhesion/barrier layer. Etching of dielectric layers (e.g., residual of elevating dielectric layer 326 and dummy dielectric layer 322) to form the openings of word line contacts 336 can be controlled by etch stop at a different material. For example, etching of dielectric layers can be stopped when reaching to conductor layers 307 in staircase structure 311.

According to one aspect of the present disclosure, a method for forming a 3D memory device is disclosed. A channel structure extending vertically through a dielectric stack including interleaved sacrificial layers and dielectric layers is formed above a substrate. A dummy channel structure extending vertically through the dielectric stack is formed by depositing a dummy dielectric layer on the dielectric stack and in a dummy channel hole. An elevating dielectric layer is formed on the dummy dielectric layer. A slit opening extending vertically through the elevating dielectric layer, the dummy dielectric layer, and the dielectric stack is formed. A memory stack including interleaved conductor layers and the dielectric layers is formed above the substrate by replacing, through the slit opening, the sacrificial layers with the conductor layers. A source contact is formed in the slit opening by depositing a source conductor layer on the elevating dielectric layer and in the slit opening. The source conductor layer on the elevating dielectric layer and at least a part of the elevating dielectric layer are removed.

In some embodiments, a thickness of the elevating dielectric layer is not less than about 100 nm. The thickness of the elevating dielectric layer is between about 100 nm and about 300 nm, according to some embodiments.

In some embodiments, the elevating dielectric layer includes silicon oxide. In some embodiments, the elevating dielectric layer and the dummy dielectric layer include a same dielectric material. Forming the elevating dielectric layer can include spin-coating a spin-on dielectric (SOD) on the dummy dielectric layer.

In some embodiments, to remove the source conductor layer on the dielectric elevating layer and the at least a part of the dielectric elevating layer, at least a part of the source conductor layer is removed to expose the underneath elevating dielectric layer by planarizing the source conductor layer, at least a part of the elevating dielectric layer is removed by etching the elevating dielectric layer, and the remaining part of the source conductor layer is removed by planarizing the source conductor layer. The planarizing can include chemical mechanical polishing (CMP), and the etching can include wet etching.

In some embodiments, prior to forming the dummy channel structure, a staircase structure is formed at one edge of the dielectric stack. In some embodiments, after removing the source conductor layer on the dielectric elevating layer and the at least a part of the dielectric elevating layer, a word line contact extending vertically through the remaining part of the elevating dielectric layer and the dummy dielectric layer is formed to contact one of the conductor layers in the staircase structure.

In some embodiments, after forming the memory stack, dishing occurs at a part of the elevating dielectric layer and the dummy dielectric layer right above the staircase structure. A top surface of the part of the elevating dielectric layer right above the staircase structure is above a top surface of another part of the dummy dielectric layer outside the staircase structure, according to some embodiments.

In some embodiments, to form the source contact, prior to depositing the source conductor layer, a lower portion of the source contact is formed by depositing polysilicon into the slit opening.

According to another aspect of the present disclosure, a method for forming a 3D memory device is disclosed. A channel structure and a dummy channel structure each extending vertically through a dielectric stack including interleaved sacrificial layers and dielectric layers are formed above a substrate. An elevating dielectric layer is formed above the dielectric stack. A thickness of the elevating dielectric layer is not less than about 100 nm. A slit opening extending vertically through the elevating dielectric layer and the dielectric stack is formed. A memory stack including interleaved conductor layers and the dielectric layers is formed above the substrate by replacing, through the slit opening, the sacrificial layers with the conductor layers. The memory stack includes a staircase structure at one edge of the memory stack. A source contact is formed in the slit opening by depositing a source conductor layer on the elevating dielectric layer and in the slit opening. The source conductor layer on the elevating dielectric layer and a part of the elevating dielectric layer are removed. A word line contact extending vertically through the remaining part of the elevating dielectric layer is formed to contact one of the conductor layers in the staircase structure of the memory stack.

In some embodiments the thickness of the elevating dielectric layer is between about 100 nm and about 300 nm.

In some embodiments, the elevating dielectric layer includes silicon oxide. Forming the elevating dielectric layer can include spin-coating a spin-on dielectric (SOD) on the dummy dielectric layer.

In some embodiments, to remove the source conductor layer on the dielectric elevating layer and the at least a part of the dielectric elevating layer, at least a part of the source conductor layer is removed to expose the underneath elevating dielectric layer by planarizing the source conductor layer, at least a part of the elevating dielectric layer is removed by etching the elevating dielectric layer, and the remaining part of the source conductor layer is removed by planarizing the source conductor layer. The planarizing can include chemical mechanical polishing (CMP), and the etching can include wet etching.

In some embodiments, to form the source contact, prior to depositing the source conductor layer, a lower portion of the source contact is formed by depositing polysilicon into the slit opening.

According to still another aspect of the present disclosure, a 3D memory device includes a substrate, a memory stack, a channel structure, a first dielectric layer, and a second dielectric layer. The memory stack includes interleaved conductor layers and dielectric layers above the substrate. The memory stack includes a staircase structure at one edge of the memory stack. The channel structure extends vertically through the memory stack. The first dielectric layer is above the memory stack. A part of the first dielectric layer right above the staircase structure has a dished bottom surface. The second dielectric layer is on the part of the first dielectric layer right above the staircase structure and has a nominally flat top surface.

In some embodiments, the 3D memory device further includes a word line contact extending vertically through the second dielectric layer and the part of the first dielectric layer and in contact with one of the conductor layers in the staircase structure of the memory stack.

In some embodiments, the second dielectric layer includes silicon oxide. In some embodiments, the first dielectric layer and the second dielectric layer include a same dielectric material. The second dielectric layer can include a spin-on dielectric (SOD).

In some embodiments, the 3D memory device further includes a dummy channel structure extending vertically through the memory stack and filled with the first dielectric layer.

In some embodiments, the 3D memory device further includes a source contact extending vertically through the memory stack and electrically connected to a source of the channel structure. A lower portion of the source contact includes polysilicon, and an upper portion of the source contact includes a metal, according to some embodiments.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
a substrate;
a memory stack comprising interleaved conductor layers and dielectric layers above the substrate, the memory stack comprising a staircase structure at one edge of the memory stack;
a channel structure extending vertically through the memory stack;
a first dielectric layer above the memory stack, a part of the first dielectric layer right above the staircase structure having a dished bottom surface, and a remaining part of the first dielectric layer over a non-staircase structure of the memory stack having a flat bottom surface; and
a second dielectric layer on the part of the first dielectric layer right above the staircase structure and having a flat top surface.

2. The 3D memory device of claim 1, further comprising a word line contact extending vertically through the second dielectric layer and the part of the first dielectric layer and in contact with one of the conductor layers in the staircase structure of the memory stack.

3. The 3D memory device of claim 1, wherein the second dielectric layer comprises silicon oxide.

4. The 3D memory device of claim 1, wherein the first dielectric layer and the second dielectric layer comprise a same dielectric material.

5. The 3D memory device of claim 1, wherein the second dielectric layer comprises a spin-on dielectric (SOD).

6. The 3D memory device of claim 1, further comprising a dummy channel structure extending vertically through the memory stack and filled with the first dielectric layer.

7. The 3D memory device of claim 1, further comprising a source contact extending vertically through the memory stack and electrically connected to a source of the channel structure.

8. The 3D memory device of claim 7, wherein a lower portion of the source contact comprises polysilicon, and an upper portion of the source contact comprises a metal.

9. A three-dimensional (3D) memory device, comprising:
a substrate;
a memory stack comprising interleaved conductor layers and dielectric layers above the substrate, the memory stack comprising a staircase structure at one edge of the memory stack;
a channel structure extending vertically through the memory stack;
a first dielectric layer above the memory stack, a part of the first dielectric layer right above the staircase structure having a dished portion; and
a second dielectric layer on the part of the first dielectric layer right above the staircase structure and having a flat top surface and a bent bottom surface matching the dished portion of the first dielectric layer.

10. The 3D memory device of claim 9, wherein the dished portion of the first dielectric layer comprises a dished top surface and a dished bottom surface.

11. The 3D memory device of claim 9, wherein a remaining part of the first dielectric layer over a non-staircase structure of the memory stack has a flat top surface and a flat bottom surface.

12. The 3D memory device of claim 11, wherein the flat top surface of the remaining part of the first dielectric layer matches the flat top surface of the second dielectric layer.

13. The 3D memory device of claim 9, further comprising a word line contact extending vertically through the second dielectric layer and the part of the first dielectric layer and in contact with one of the conductor layers in the staircase structure of the memory stack.

14. The 3D memory device of claim 9, wherein the second dielectric layer comprises silicon oxide.

15. The 3D memory device of claim 9, wherein the first dielectric layer and the second dielectric layer comprise a same dielectric material.

16. The 3D memory device of claim 9, wherein the second dielectric layer comprises a spin-on dielectric (SOD).

17. The 3D memory device of claim 9, further comprising a dummy channel structure extending vertically through the memory stack and filled with the first dielectric layer.

18. The 3D memory device of claim 9, further comprising a source contact extending vertically through the memory stack and electrically connected to a source of the channel structure.

19. The 3D memory device of claim 18, wherein a lower portion of the source contact comprises polysilicon, and an upper portion of the source contact comprises a metal.

20. The 3D memory device of claim 19, wherein the upper portion of the source contact has a length larger than a combined thickness of the first dielectric layer and the second dielectric layer at a corresponding location.

* * * * *